(12) United States Patent
Choi

(10) Patent No.: US 8,471,617 B2
(45) Date of Patent: Jun. 25, 2013

(54) DUTY CYCLE CORRECTION IN A DELAY-LOCKED LOOP

(75) Inventor: Minseok Choi, Ichon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 565 days.

(21) Appl. No.: 12/818,127

(22) Filed: Jun. 17, 2010

(65) Prior Publication Data

US 2011/0309869 A1  Dec. 22, 2011

(51) Int. Cl.
*H03K 3/017* (2006.01)
(52) U.S. Cl.
USPC .......................................................... 327/175
(58) Field of Classification Search
USPC .......................................................... 327/175
See application file for complete search history.

(56) References Cited

U.S. PATENT DOCUMENTS 6,459,314 B2 * 10/2002 Kim ............................... 327/161

FOREIGN PATENT DOCUMENTS

| KR | 10-2004-0037786 A | 5/2004 |
|---|---|---|
| KR | 10-2008-0014392 A | 2/2008 |
| KR | 10-2008-0056544 A | 6/2008 |
| KR | 10-2010-0053045 A | 5/2010 |

* cited by examiner

*Primary Examiner* — Daniel Rojas
(74) *Attorney, Agent, or Firm* — Kilpatrick Townsend & Stockton LLP

(57) ABSTRACT

Circuits, methods, and apparatus that provide duty-cycle error correction for clock and other periodic signals. One example provides a duty-cycle correction that can be used to improve the duty cycle of a clock signal that is received by, or generated by, a delay-locked loop. This example receives an input clock signal and uses a variable delay element to construct an improved duty-cycle output clock signal. The duty cycle of the output clock is examined to determine if the delay element is providing excess or insufficient delay. The delay of the delay element is then adjusted. To improve response times, a successive approximation technique is used to determine the most significant bits of a count that adjusts the delay through the delay element. To improve accuracy, a linear technique is used to adjust the least significant bits of the count.

20 Claims, 12 Drawing Sheets

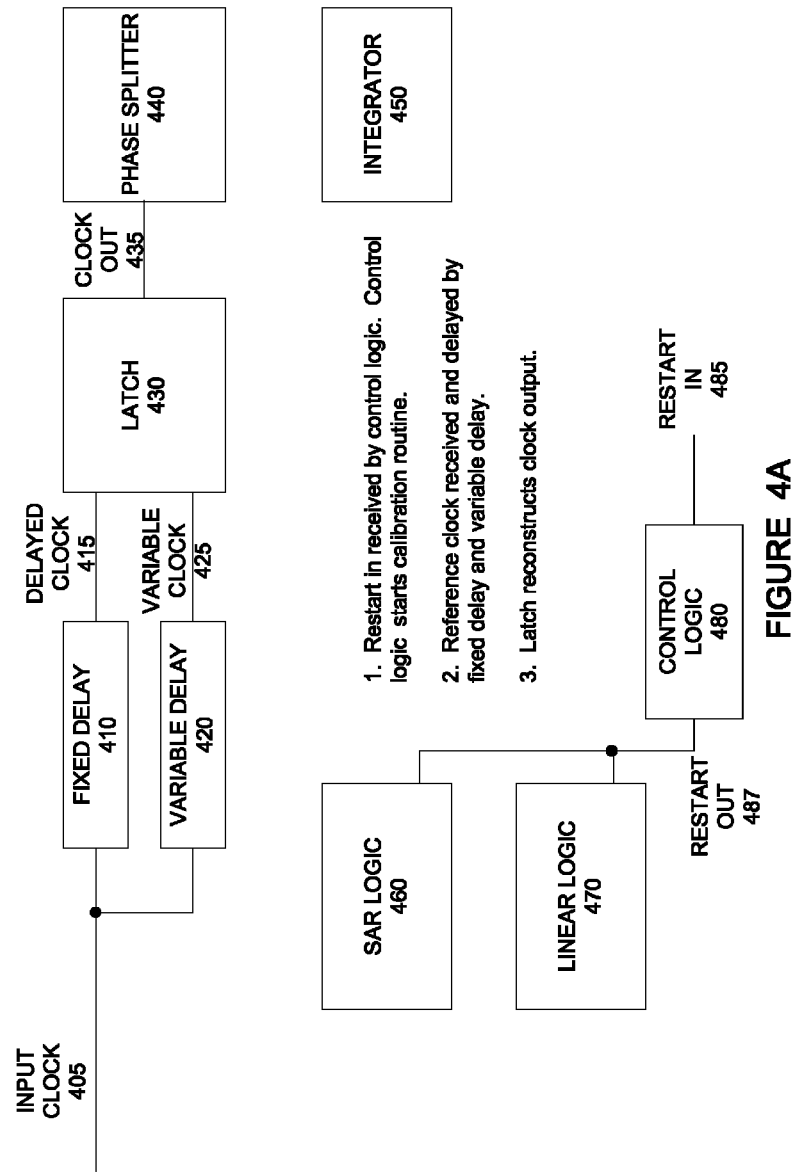

DUTY CYCLE CORRECTION IN A DELAY-LOCKED LOOP

BACKGROUND

Closed-loop clock circuits, such as phase-locked and delay-locked loops, are useful in many applications, including clock and data recovery, data retiming, clock regeneration, and other functions. Delay-locked loops are particularly useful in high-speed systems such as high-speed memory systems.

Delay-locked loops can generate clock signals, or they can receive clocks signals. For example, a delay-locked loop in a first circuit may generate and provide a clock signal to a delay-locked loop in a second circuit. These delay-locked loops can clean up clock signals by removing jitter and spurious noise components. They can also retime signals to improve the performance of data transfer systems.

The duty cycle of these clock signals may become corrupted. For example, driver pull-up and pull-down capabilities may be mismatched. That is, a driver may pull a voltage on a bus line low faster than the driver can pull it high. This in turn causes skew between clock rising and falling edges. Also, coupling from other signals may speed up one edge or slow another edge, again causing skew between clock edges. Trace capacitance may slow rising and falling edges of a clock signal received by an input buffer or other circuit. If the switch point of the receiving circuit is not centered, the recovered clock signal may have duty-cycle errors.

These duty-cycle errors add to any jitter component in the clock signal. As such, edges of the clock signal may not be centered on received data. Accordingly, these clock duty-cycle errors may degrade data transmission and increase data transfer error rates.

Closed-loop clock circuits by themselves typically cannot improve a clock signal duty cycle. While they are capable of removing transitory jitter, they are not capable of removing static errors in a duty-cycle distortion. Accordingly, additional circuitry may be used.

Thus, what is needed are circuits, methods, and apparatus that provide duty-cycle error correction for clock and other periodic signals received by or generated by closed-loop clock circuits, such as phase-locked and delay-locked loops.

SUMMARY

Accordingly, embodiments of the present invention provide circuits, methods, and apparatus that provide duty-cycle error correction for clocks and other periodic signals received by or generated by closed-loop clock circuits. One embodiment of the present invention provides a duty-cycle correction that can be used to improve the duty cycle of a clock signal that is received by, or generated by, a delay-locked loop.

This embodiment of the present invention receives an input clock signal and uses a variable delay element to construct an improved duty-cycle output clock signal. The duty cycle of the output clock is examined to determine if the delay element is providing excess or insufficient delay. The delay of the delay element is appropriately adjusted.

In a specific embodiment of the present invention, the delay is adjusted using a combination of techniques. To improve response times, a successive approximation technique is used to determine the most significant bits of a count that is used to adjust the delay through the variable delay element. To improve accuracy, a linear technique is used to adjust the least significant bits of the count.

In this specific embodiment of the present invention, the count may be set during a power-on or initialization time. As operating conditions such as temperature and voltage vary, the count may need to be adjusted. However, it is difficult to secure enough time for a full recalibration of the count. For this reason, one or two of the lower bits of the count may be adjusted at various times. In this case, successive approximation and linear circuitry may be restarted during chip operations. During a restart, the clock signal may be disturbed. Accordingly, the trigger for these restarts may be the issuance of commands such as READ or REFRESH. During a read, data is read from a memory and the clock is not needed. Similarly, during a refresh cycle, variations in the clock duty cycle may be acceptable. At these times, since the clock signal is not needed, or errors are acceptable, the clock signal may be readjusted by a restart without negatively effecting device performance. During such a restart, either or both of the successive approximation and linear circuits may be restarted.

In one embodiment of the present invention, an input clock signal is received by a fixed delay line and a variable delay line. In various embodiments of the present invention, the delay through the variable delay line may be shorter than, equal to, or longer than, the delay through the fixed delay line. A latching circuit then combines the output of the fixed delay line and the variable delay line and constructs an output clock signal having an improved duty cycle. The output clock signal may be integrated. The output of the integrator may be received by a successive approximation logic circuit and a linear logic circuit, which generate a count that adjusts the delay through the variable delay line.

Various embodiments of the present invention may incorporate one or more of these and the other features described herein. A better understanding of the nature and advantages of the present invention may be gained by reference to the following detailed description and the accompanying drawings.

BRIEF DESCRIPTION OF THE DRAWINGS

FIGS. 4A-4C illustrate a signal flow around a loop of a duty-cycle correction circuit according to an embodiment of the present invention;

DESCRIPTION OF ILLUSTRATIVE EMBODIMENTS

Figure 1:
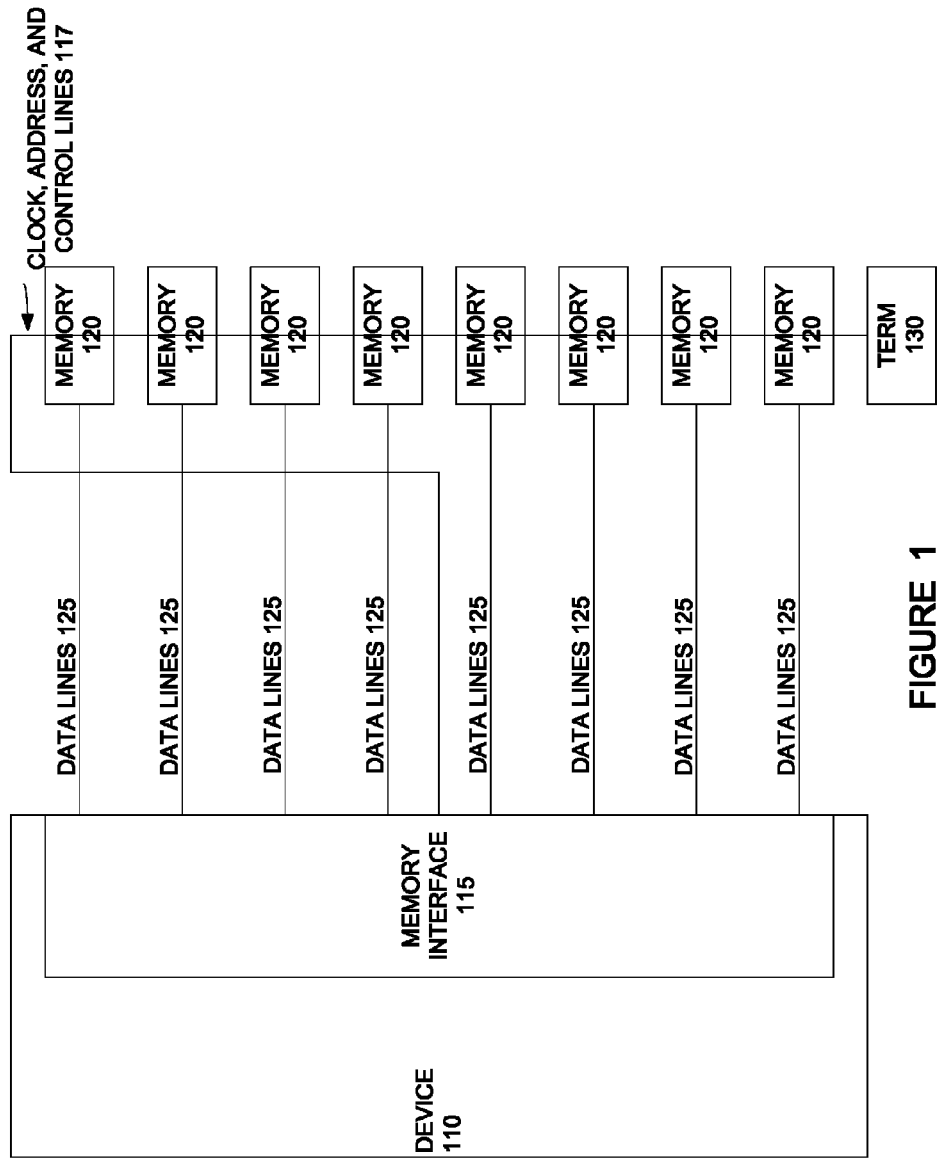
FIG. 1 illustrates a memory subsystem that is improved by the incorporation of an embodiment of the present invention.

FIG. 1 illustrates a memory subsystem that is improved by the incorporation of an embodiment of the present invention.

This memory subsystem may be compatible with DDR3 or other memory standards. This figure, as with the other included figures, is shown for illustrative purposes and does not limit either the possible embodiments of the present invention or the claims.

In this memory subsystem, device 110 stores data in, and retrieves data from, a number of memories 120. Device 110 includes memory interface 115 that couples through data lines 125 to memories 120. Memory interface 115 provides clock, address, and control signals to the memories 120 on lines 117. Lines 117 are terminated by termination 130. The clock signals provided on lines 117 may be single-ended or differential signals. In various embodiments of the present invention, they may be unidirectional or bidirectional signals.

In this example, clock signals are provided by memory interface 115 to the memories 120. The clock lines follow a flyby route; that is, they are routed sequentially from one memory 120 to the next. The clock lines are terminated by termination 130. Termination 130 may include resistors or other terminating components.

Again, this circuitry is a memory subsystem where communications take place between device 110 and memories 120. Device 110 may be a processor, graphics processor, or other type of circuit. Memories 120 may be dynamic random access memories, or other types of memory devices. Interface 115 and memories 120 may be compatible with standards such as DDR3, or other standard or proprietary memory specifications.

Other types of electronic systems and circuits may be improved by the incorporation of embodiments of the present invention. Again, this memory subsystem employs a flyby routing technique for the clock lines. In other embodiments of the present invention, other circuit topologies, such as star routing, may be used.

Again, in this flyby topology, the clock is received by each memory 120 sequentially. Memories 120 that are closer to termination 130 receive the clock signal last, while memories further away from termination 130 receive the clock signal earlier. For this reason, duty-cycle performance may be worse at the memories 120 closest to termination 130. In order to improve performance, memory interface 115 and memories 120 may incorporate embodiments of the present invention. An example is shown in the following figure.

Figure 2:
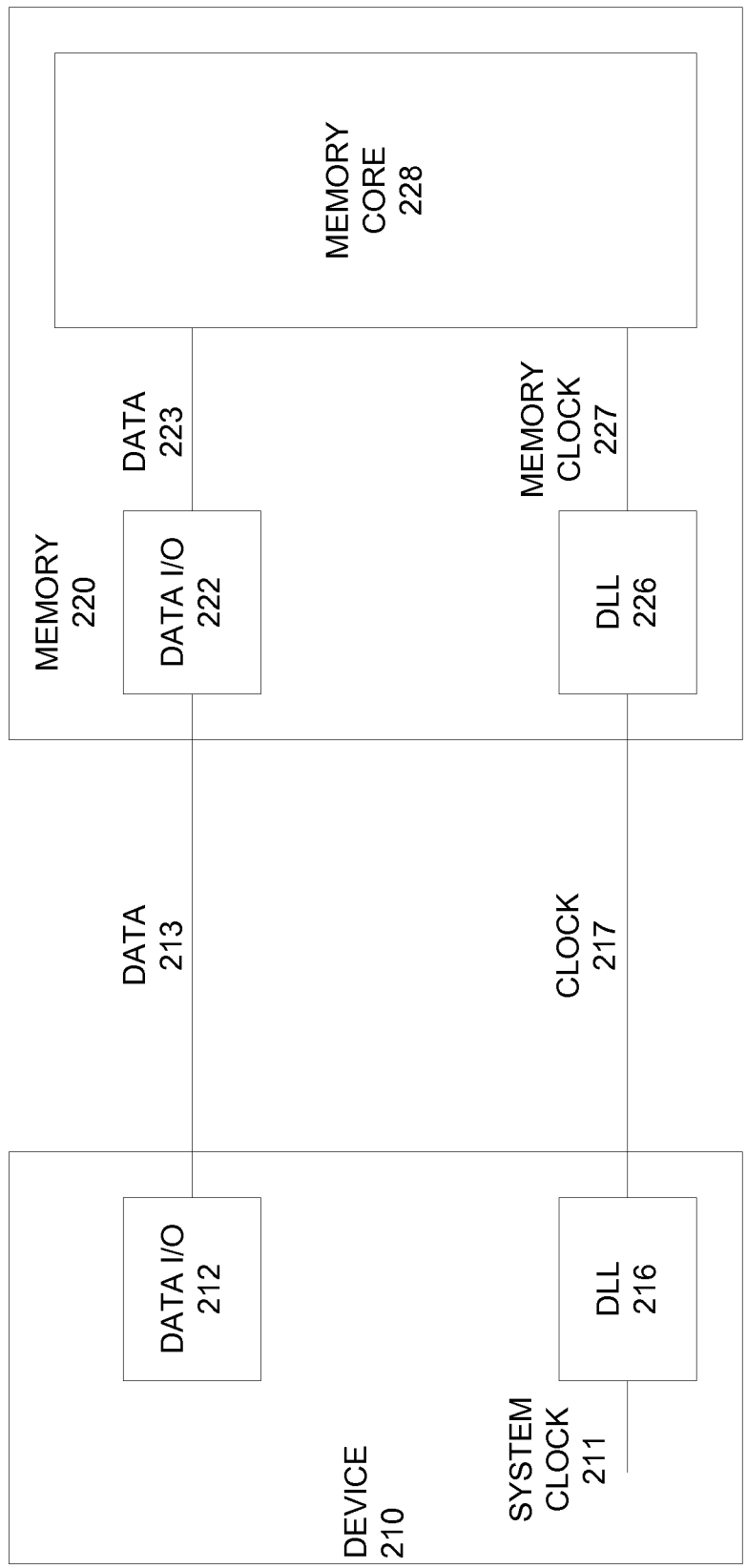
FIG. 2 illustrates a portion of a memory subsystem that is improved by the incorporation of embodiment of the present invention.

FIG. 2 illustrates a portion of a memory subsystem that is improved by the incorporation of embodiment of the present invention. This figure includes device 210 that is in communication with memory 220. Data is sent and received by device 210 using data I/O circuitry 212. Data is received and provided by memory 220 using data I/O circuitry 222. Data I/O circuitry 222 provides and receives data from the memory core 228 on lines 223.

In one system improved by an embodiment of the present invention, in device 210, a system clock on line 211 is retimed by delay-locked loop 216 and provided on line 217. The clock signal on line 217 is received by delay-locked loop 226 in memory 220 and provided to the memory core 228 on the memory clock lines 227. In this way, device 210 can retime the system clock signal provided on line 211 using delay-locked loop 216. Similarly, memory 220 can retime the clock signal received on line 217 using delay-locked loop 226. This in turn provides improved accuracy and data transfers between device 210 and memory 220.

In other systems that are improved by embodiments of the present invention, either or both of the delay-locked loops 216 and 226 can be replaced by phase-locked loops, clock generators or drivers, or other closed or open loop clock circuits. In one such system, delay-locked loop 216 is replaced by a phase-locked loop. In this system, a system clock received on line 211 is retimed by a phase-locked loop and received on line 217 by delay-locked loop 226. In another such system, a system clock received on line 211 is driven by a clock diver and received on line 217 by delay-locked loop 226.

In still other embodiments of the present invention, a separate delay-locked loop, phase-locked loop, or clock driver or generator may provide a clock signal on line 217. This clock signal may be retimed or driven by delay-locked loops, phase-locked loops, or clock drivers in device 210 and memory 220.

Again, periodic or clock signal received by, or generated by, the delay-locked loops 216 and 226 may have corrupted or distorted duty cycles. Again, this may be due to driver mismatch, signal coupling, excess line capacitance, or other phenomena. Accordingly, embodiments of the present invention provide methods, circuits, and apparatus that can improve the duty cycles of one or more of these signals. An example of such a circuit is shown the following figure.

Figure 3:
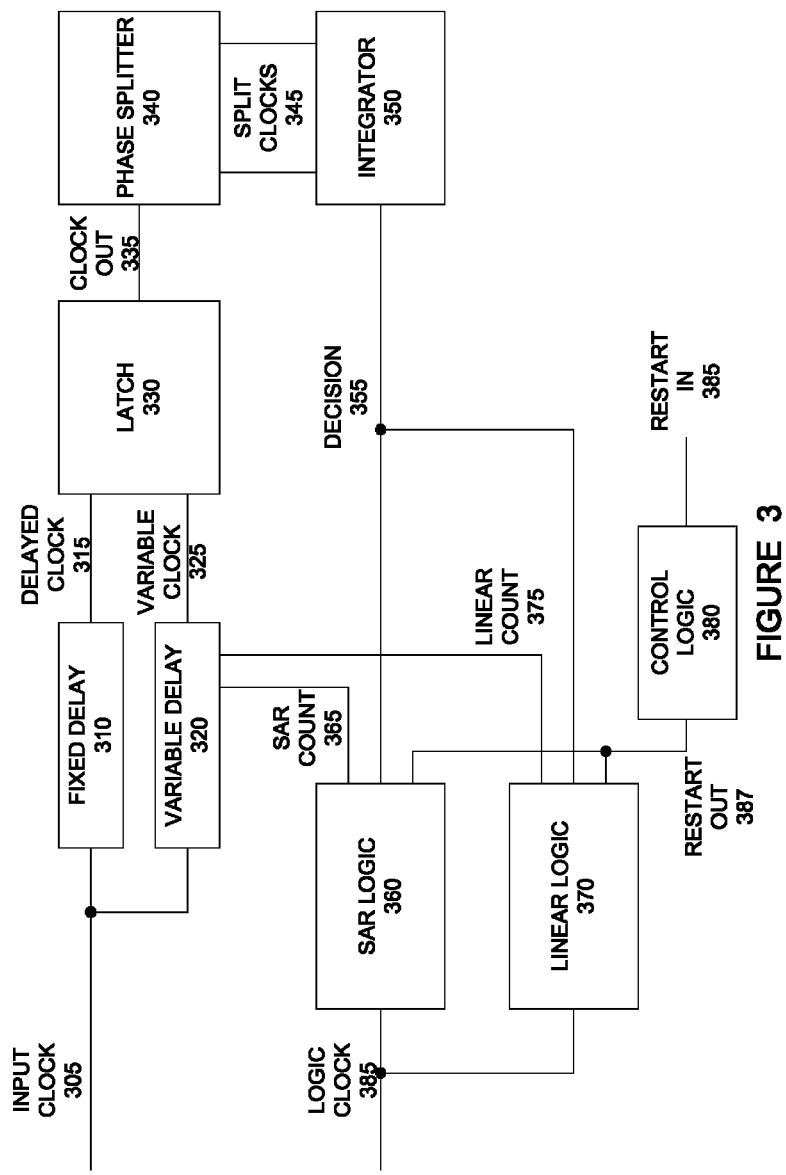
FIG. 3 illustrates a duty-cycle correction circuit according to an embodiment of the present invention.

FIG. 3 illustrates a duty-cycle correction circuit according to an embodiment of the present invention. An input clock is received on line 305. The input clock on line 305 may be a signal received by a delay-locked loop, a signal provided by a delay-locked loop, or it may be another signal. The input clock on line 305 may be generated by a crystal, or other periodic or other type of source. The frequency of the input clock may be 500 MHz, 1 GHz, 2 GHz, or other frequency.

The input clock on line 305 is received by fixed delay 310 and variable delay 320. The fixed delay 310 provides a delayed clock on line 315 to latch 330. Variable delay 320 provides a variable delayed clock on line 325 to latch 330. The fixed and variable delay elements may be formed using current starved inverters, or other circuit techniques. In various embodiments of the present invention, variable delay 320 may provide a delay that is shorter than, equal to, or longer than fixed delay 310. In other embodiments of the present invention, the delay provided by variable delay 320 may be shorter than the delay provided by fixed delay 310, or the delay provided by variable delay 320 may be longer than the delay provided by fixed delay 310.

Latch 330 uses edges of the fixed delay clock on line 315 and the variable delay clock on line 325 to generate a clock output signal on line 335. The clock output signal on line 335 may be provided as an output clock from a delay-locked loop, it may be provided as an input to the delay-locked loop, or it may be used in other ways. The clock output on line 335 is split by phase splitter 340 into split clocks on lines 345. In one embodiment of the present invention, phase splitter 340 is a number of inverters providing two versions of the clock output signal on line 335, where the two split clocks are 180° out of phase.

Integrator 350 receives the split clocks on line 345 and integrates them. Accordingly, if the duty cycle of the split clocks on line 345 is such that the signal is high, the output of the integrator 350 also tends to be high.

The output of the integrator 350 generates a decision signal on line 355 and provides it to successive approximation logic 360 and linear logic 370. Successive approximation logic 360 and linear logic 370 are clocked by a logic clock signal on line 385. The frequency of the logic clock signal on line 385 may be much less than the frequency of the input clock on line 305. In this way, several cycles of the input clock signal on line 305 may be integrated before being used by the successive approximation logic circuit 360 and linear logic circuit 370.

Successive approximation logic circuit 360 generates a successive approximation count on line 365 and provides it to the variable delay 320. Linear logic circuit 370 generates a linear count and provides it on line 375 to the variable delay 320.

In an embodiment of the present invention, successive approximation logic 360 is used to generate the most significant bids of the count provided to variable delay 320. In this embodiment, linear logic 370 is used to provide the least significant bids of the count to delay 320.

Using successive approximation logic to generate the most significant bits allows the variable delay 322 be set relatively close to a final value in a very rapid manner. However, successive approximation techniques tend to be inaccurate. Accordingly, more accurate linear logic 370 is used to generate the least significant bits of the count provided to the variable delay 320. In this way, successive approximation logic is used to improve speed, while linear logic 370 is used to improve accuracy.

The count may be generated during a calibration routine run during a power-on, initialization period, or other such time. Again, as the temperature and supply voltage for the device changes, the desired count may changes. Accordingly, the count may be updated during appropriate periods. Since the duty cycle may be disrupted during such a restart, the count may be updated during a time where the clock is not needed, or when errors in duty cycle may be acceptable. Such a time may occur when a READ or a RESTART command is issued.

Accordingly, a control logic circuit 380 is provided. Control logic circuit 380 receives a restart in signal on line 385. The restart in signal on line 385 may be triggered by the issuance of a READ or RESTART command, or a power-on or initialization command or event. Control logic 380 may provide a restart out signal on line 387 to either or both the successive approximation 360 or linear logic 370. For example, during a power-on or initialization, control logic may provide a restart out signal to the successive approximation 360 and linear logic 370 to begin the initial calibration routine. During operation, a command may be sent to either or both successive approximation 360 and linear logic 370 to instruct the circuits to restart and update the count to compensate for temperature and voltage variations.

Again, in this example, a variable delay is used in generating a clock signal having improved duty cycle. The clock signal having improved duty cycle is integrated, and the result is used to generate a count to control the variable delay. Again, the count is generated using a combination of successive approximation and linear techniques to improve both the speed and accuracy of the loop. These activities are shown in the following figures.

Figure 4B:
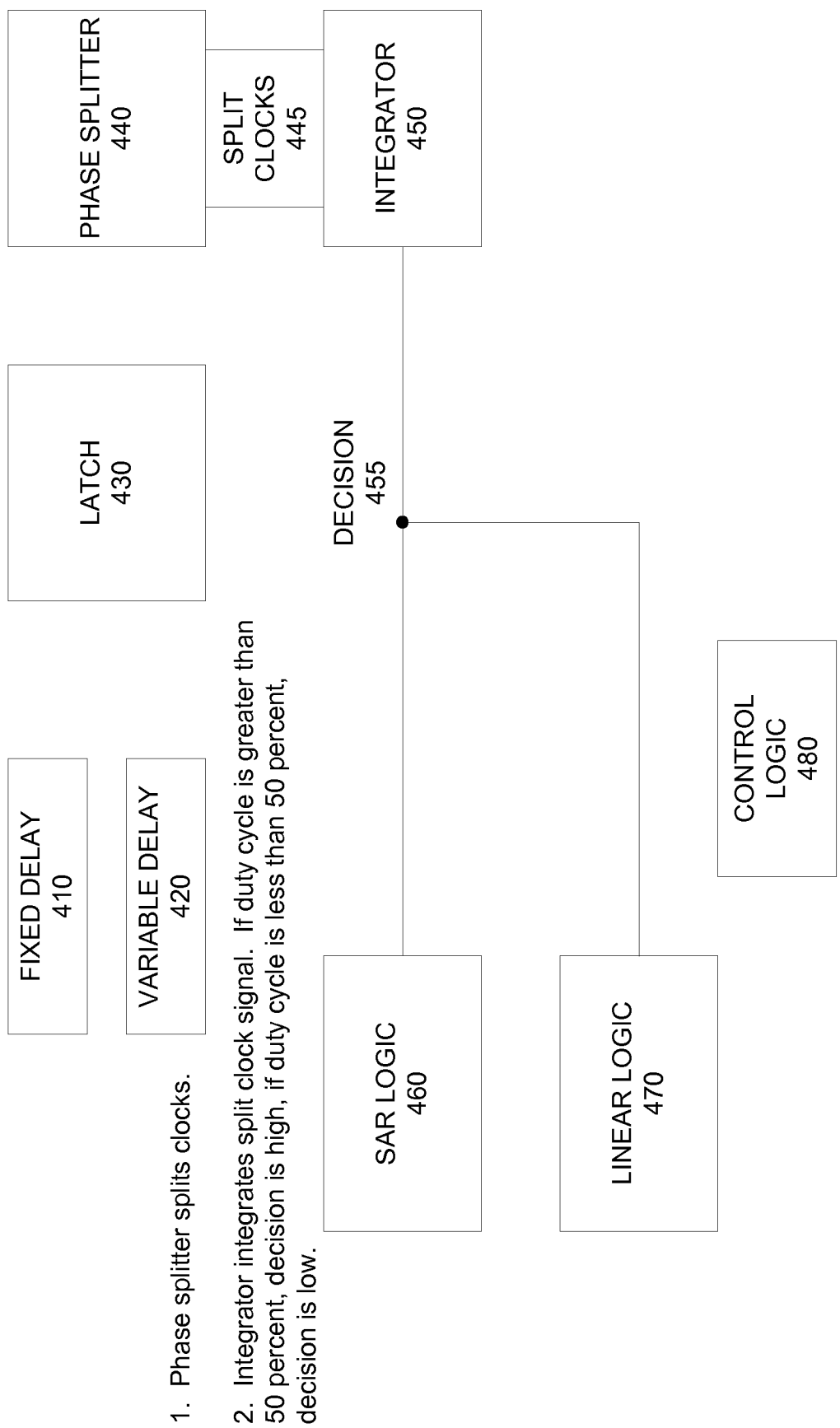
Figure 4C:
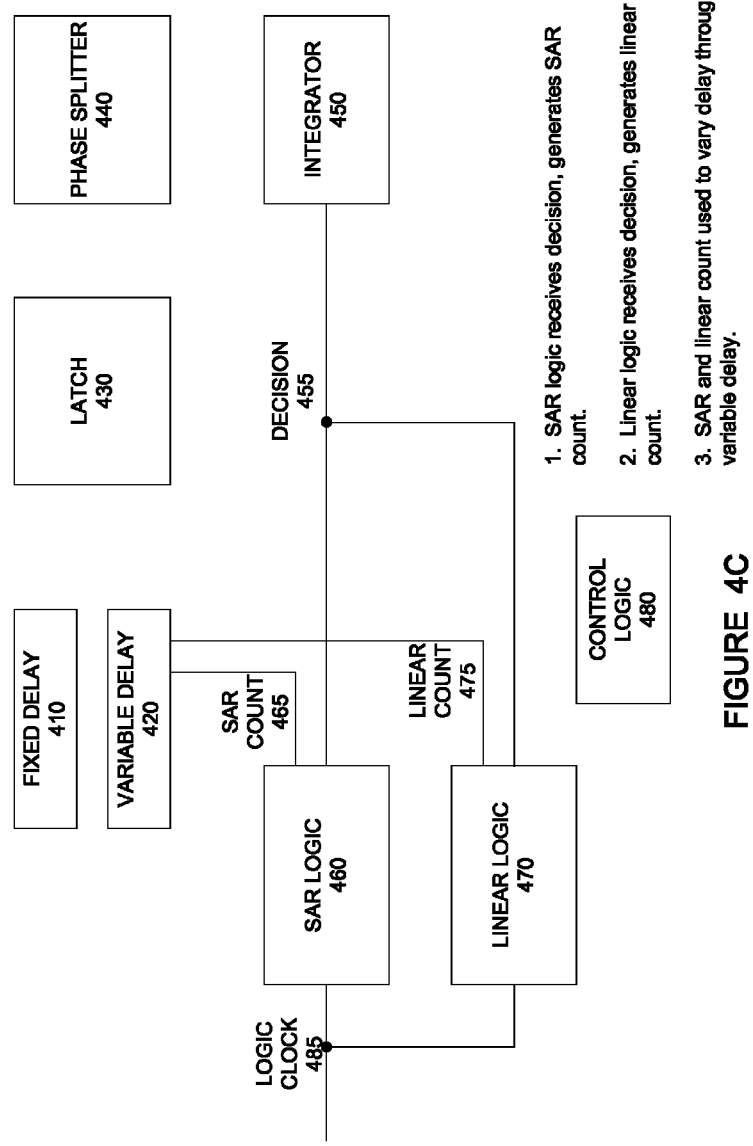

FIGS. 4A-4C illustrate a signal flow during a calibration routine for a duty-cycle correction circuit according to an embodiment of the present invention. In FIG. 4A, a restart in signal is received on line 485 by control logic 480. Control logic 480 provides a restart out signal to either or both the successive approximation logic 360 and linear logic 370 circuits to start the calibration routine. An input clock is received and delayed by a fixed delay element 410 and a variable delay element 420. A latch 430 reconstructs an output clock.

In FIG. 4B, phase splitter 440 splits the clock signal into two signals that have opposing polarities. That is, phase splitter 440 splits the clock signal into two signals separated by 180 degrees. Integrator 450 integrates the split clock signal. When the duty cycle is greater than 50 percent, a high decision is output on line 455, while when the duty cycle is less than 50 percent, the decision output on line 455 is low, though in other embodiments of the present invention, other polarities for the decision signal on line 455 may be used.

In FIG. 4C, the successive approximation logic receives the decision and generates a successive approximation count. Once the successive approximation logic has completed its task, the linear logic receives the decision and generates a linear count. The successive approximation and linear counts are then used to vary the delay through the variable delay 420.

In a specific embodiment of the present invention, the above calibration routine takes approximately 512 clock cycles to complete. Accordingly, a full calibration typically only takes place during power-on and initialization times. However, device operating conditions such as temperature and voltage may change over time. These changes may cause the duty cycle of the output clock signal to drift.

Accordingly, embodiments of the present invention provide adjustments to the count provided to the variable delay line. Since these adjustments may disturb the clock signal, they may occur when it is known that the output clock signal is not needed, or when errors in the duty cycle are acceptable. This may occur upon the issuance of commands such as a READ or REFRESH command. For example, where an embodiment of the present invention is incorporated in a memory device, the clock signal may not be needed when data is read from the memory device. In various embodiments of the present invention, either or both the successive approximation or linear logic may be restarted under these conditions. In a specific embodiment of the present invention, when data is read from the memory, one or two least significant bits provided by linear logic circuit 470 may be recalibrated. If data is read from memory long enough for at least a bit to be recalibrated, the recalibrated bit is used, otherwise it is discarded.

Accordingly, a control logic circuit 480 is included. Control logic circuit 480 receives a restart in signal on line 485. This signal may be triggered by a command such as a READ, REFRESH, or other signal. Control logic circuit 480 may provide a restart out signal on line 487. This signal may be provided to either or both the successive approximation logic 460 and the linear logic 470.

In the above figures, a variable delay is used in constructing an output clock. The output clock is analyzed to determine whether its duty cycle is greater than or less than 50 percent. This information is used by successive approximation logic and linear logic to generate a count signal to control the variable delay. A method employing these concepts according to an embodiment of the present invention is shown in the following figure.

Figure 5:
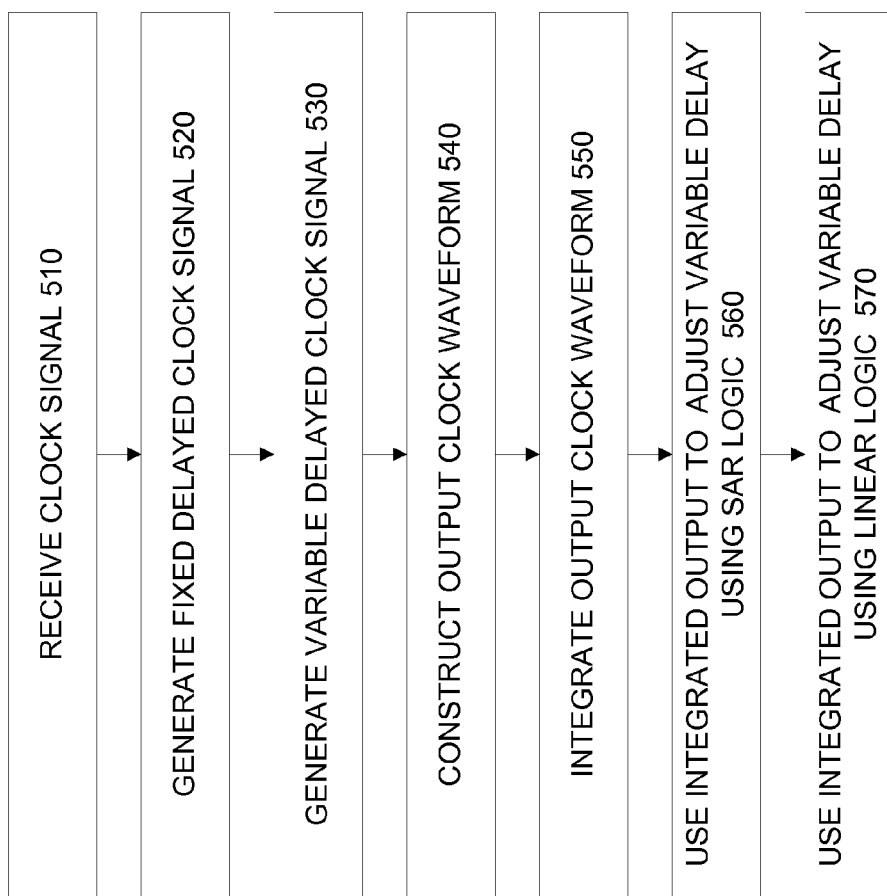
FIG. 5 illustrates a method of constructing a periodic or clock signal having an improved duty cycle according to an embodiment of the present invention.

FIG. 5 illustrates a method of constructing a periodic or clock signal having an improved duty cycle according to an embodiment of the present invention. In act 510, a clock signal is received. In act 520, a fixed delayed clock signal is generated, while a variably delayed clock signal is generated in act 530. In act 540, an output clock waveform is constructed using the fixed delayed clock signal and the variably delayed clock signal. In act 550, the output waveform is integrated. The integrated output waveform is used to adjust the variable delay using successive approximation logic in act 560. The integrated output waveform is used to adjust the variable delay using linear logic in act 570.

Again, the fixed delay element and the variable delay element may be formed using current starved inverters or other circuit techniques. The variable delay may provide a delay that is shorter than, equal to, or longer than the delay provided by the fixed delay. An example of a fixed delay and a variable delay are shown in the following figure.

Figure 6:
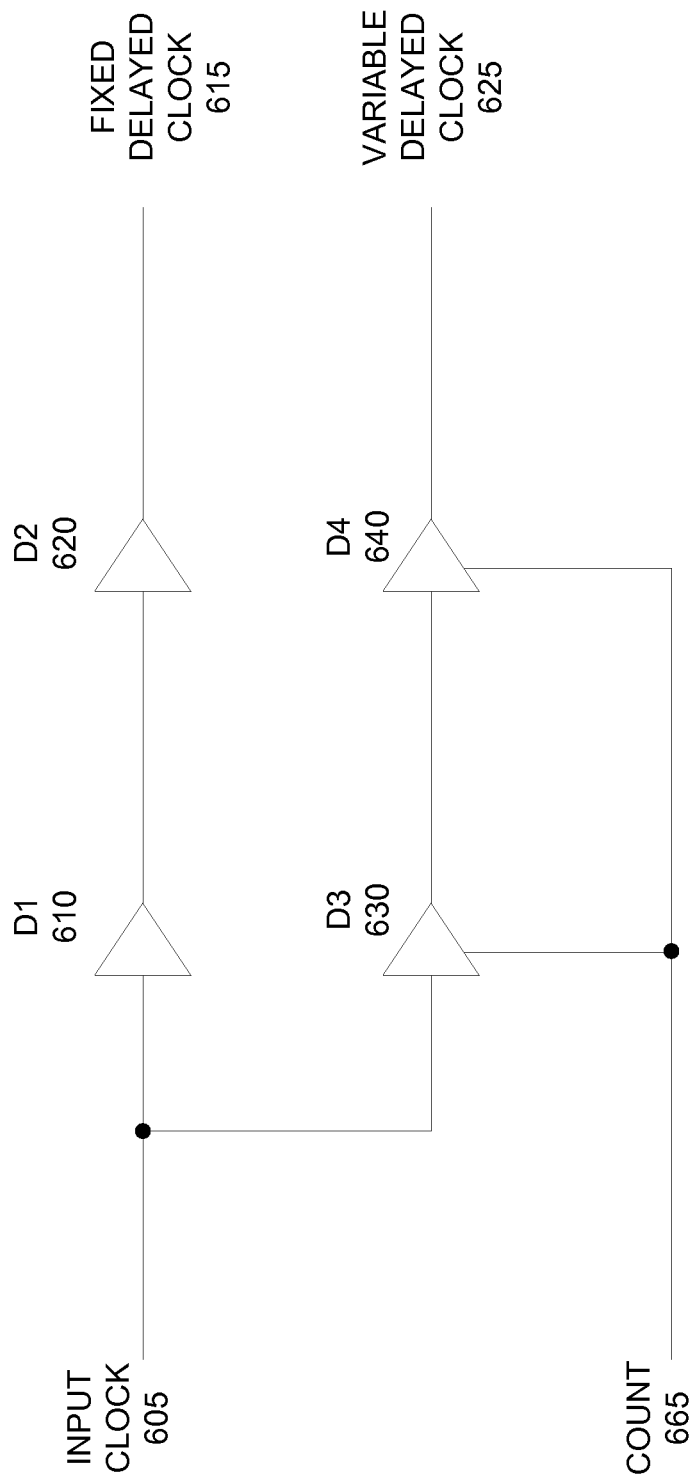
FIG. 6 illustrates a fixed delay and a variable delay according to an embodiment of the present invention.

FIG. 6 illustrates a fixed delay and a variable delay according to an embodiment of the present invention. An input clock is received on line 605 by fixed delay element D1 610 and variable delay element D3 630. The output of delay element D1 610 is received by fixed delay element D2 620, which provides a fixed delayed clock on line 615. The output of variable delay element D3 630 is received by variable delay elements D4 640, which provides a variable delay clock on line 625. The delay through delay elements D3 630 and D4 640 are controlled by a count received on lines 665. In other embodiments of the present invention, other numbers of delay elements may be used.

Again, latch circuits 330 may be used to construct a clock signal having an improved duty cycle. An example of the operation of one such circuit is shown in the following figure.

Figure 7:
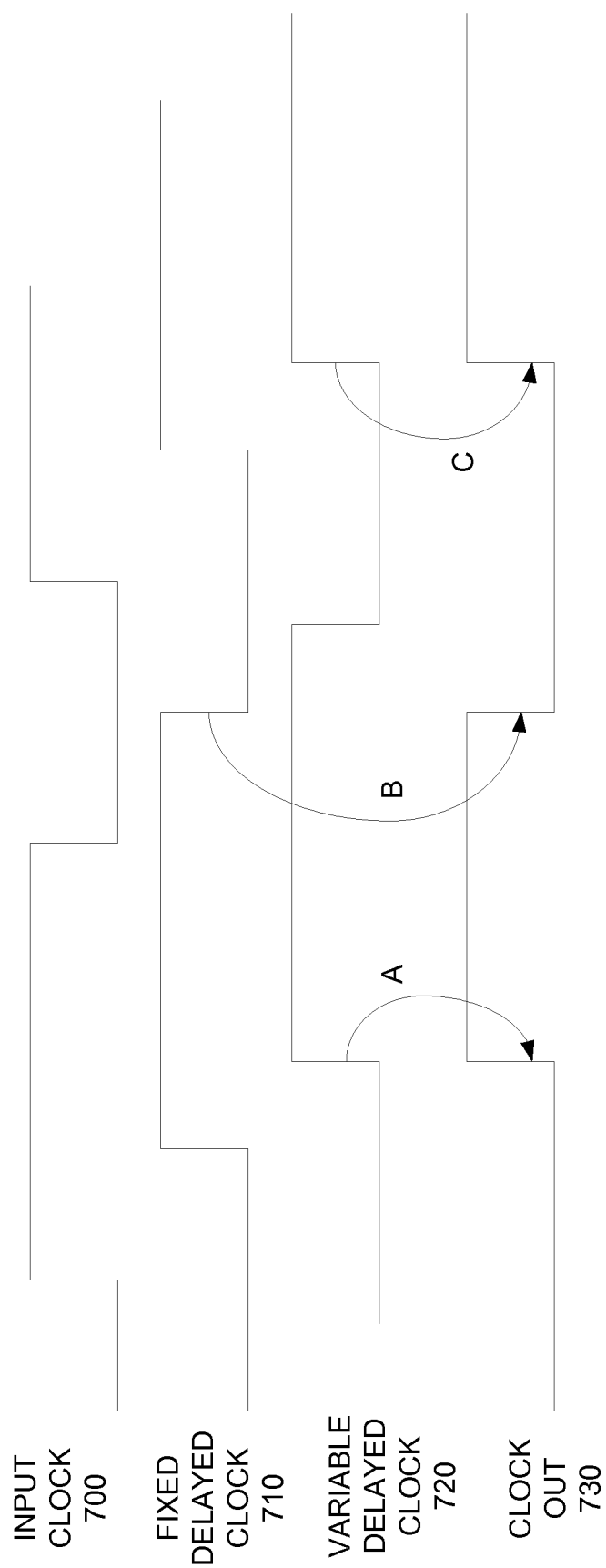
FIG. 7 illustrates the construction of a clock signal having an improved duty cycle according to an embodiment of the present invention.

FIG. 7 illustrates the construction of a clock signal having an improved duty cycle according to an embodiment of the present invention. In this example, an input clock 700 is received, where its duty cycle is not 50 percent, but is rather much lower. From this input clock, a fixed delay clock signal 710 and a variable delay clock signal 720 are generated. The fixed delayed clock signal 710 has a duty cycle that is not 50 percent. Similarly, the variable delayed clock signal 720 does not have a 50 percent duty cycle.

A clock output 730 can be constructed using rising edges of the variable delayed clock 720 and falling edges of the fixed delayed clock 710, as shown. Specifically, rising edges of variable delayed clock 720 are used, as indicated by arrows A and C. Rising edges of the fixed delayed clock 710 are used, as is indicated by arrow B. In this way, a clock out signal 730 having improved duty cycle is constructed. In other embodiments of the present invention, other edges of the delayed clock signals can be used. As can be seen, the duty cycle of the clock out signal 730 is 50 percent when the delay of the variable delayed clock 720 is accurately set. That is, inaccuracies in the delay of the variable delay clock 720 lead to inaccuracies in the duty cycle of the clock out signal 730.

Again, this clock signal may be split and integrated. An example of this integration is shown in the following figure.

Figure 8:
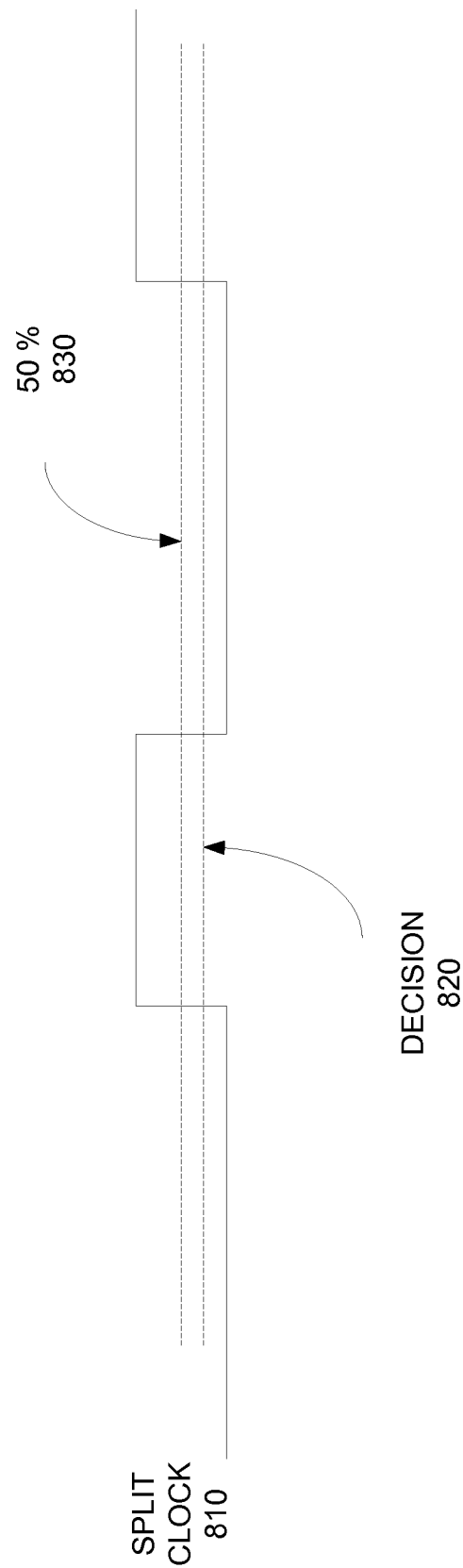
FIG. 8 illustrates the integration of a clock signal according to an embodiment of the present invention.

FIG. 8 illustrates the integration of a clock signal according to an embodiment of the present invention. In this example, only one side of a split clock signal 810 is shown for simplicity. In this example, the duty cycle of the split clock signal 810 is much less than 50 percent. Accordingly, the integrated voltage level, decision 820, is below the 50 percent mark 830. This signal can be gained up to provide a logic level signal to the successive approximation and linear logic circuits. An example of a successive approximation logic circuit that can receive this decision signal is shown in the following figure.

Figure 9:
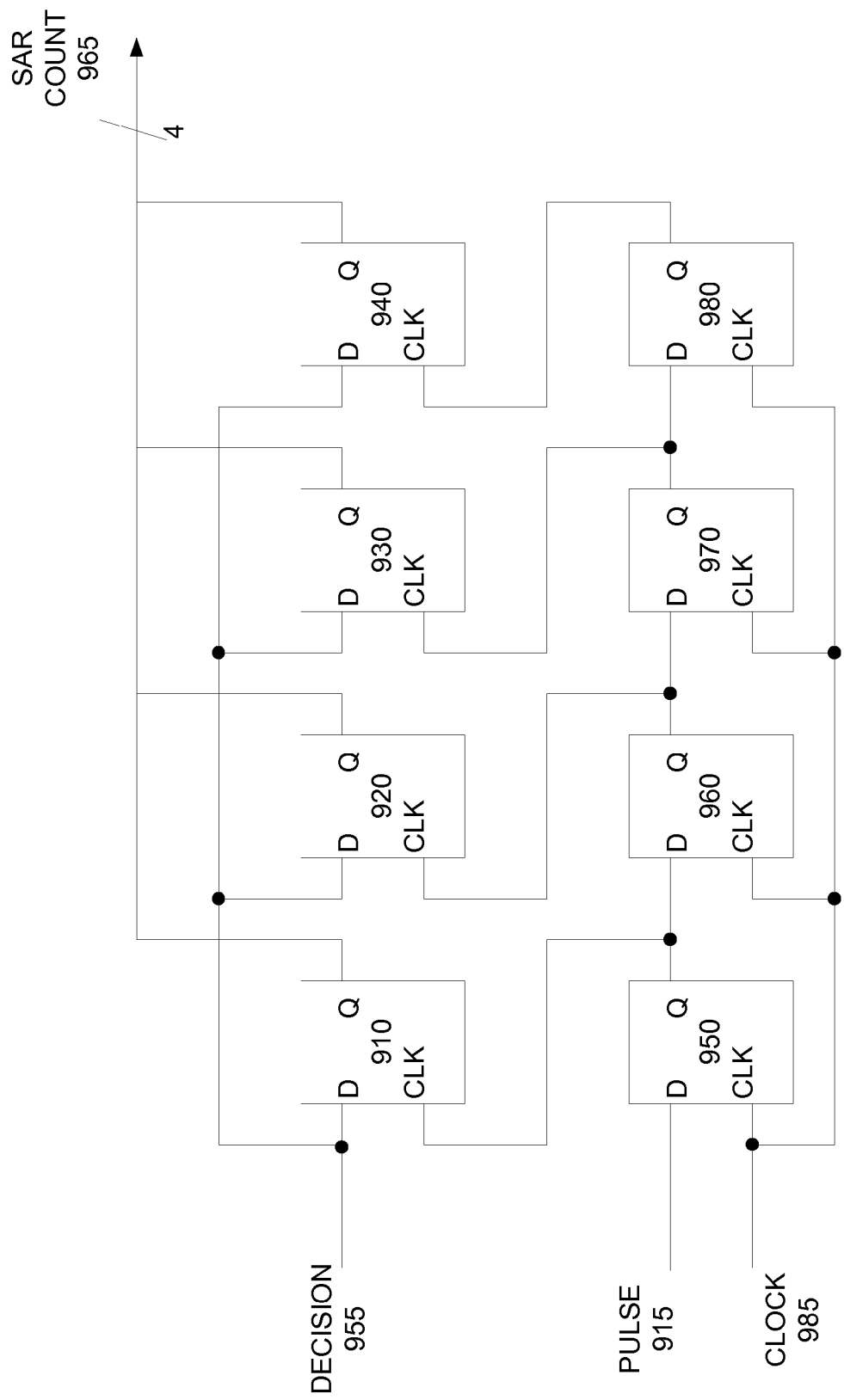
FIG. 9 illustrates a successive approximation logic circuit according to an embodiment of the present invention.

FIG. 9 illustrates a successive approximation logic circuit according to an embodiment of the present invention. This figure includes two banks of registers, registers 910-940 and registers at 950-980.

The lower bank of registers 950-980 receive a pulse signal on line 915, and a clock signal on line 985. The pulse signal may be a single pulse that is provided during power-on or initialization conditions when the loop is calibrated. Again, the frequency of the clock signal on line 985 may be much lower than the frequency of the input clock signal. The pulse signal is received on line 915 and ripples through registers 950-980. The pulse signal on line 915 clocks registers 910-940 in succession as pulse 915 ripples through registers 950-980. As each of the registers 910-940 are clocked, the level of the decision signal on line 955 is stored in the corresponding register. The outputs of the registers provide a successive approximation count on lines 965. In this example, four bits of a successive approximation register count are provided on lines 965, though in other embodiments of the present invention, other numbers of bits may be provided.

Again, embodiments of the present invention employ successive approximation techniques to generate the most significant bits of a count that controls a delay through a variable delay element. An example of this is shown in the following figure.

Figure 10:
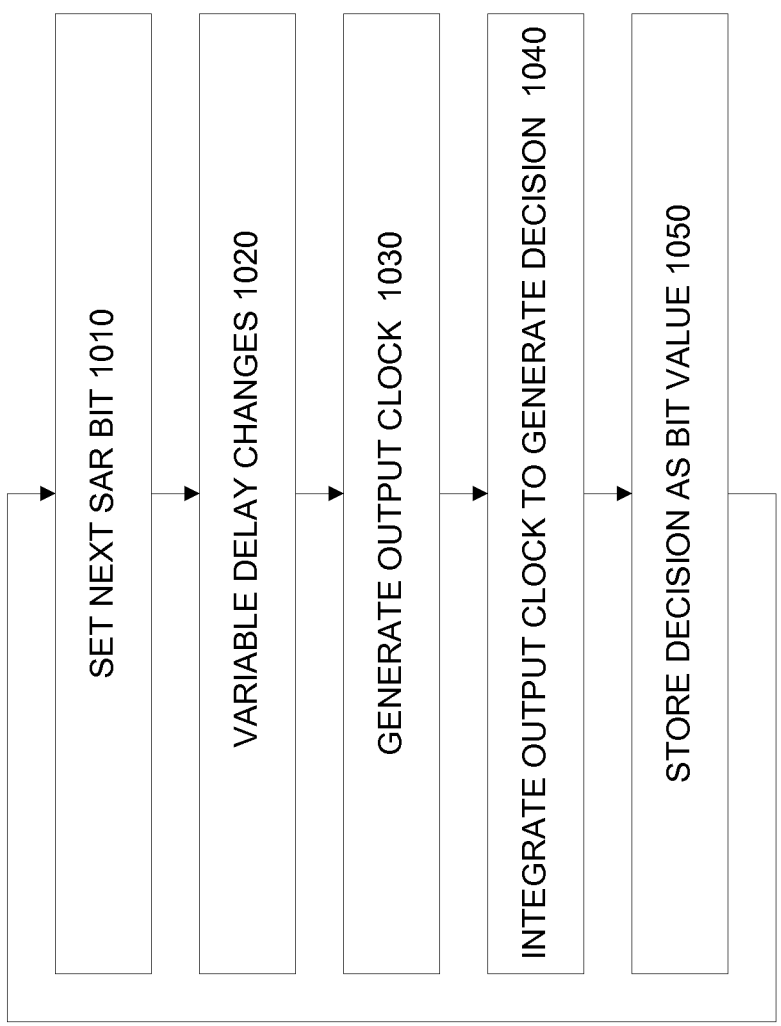
FIG. 10 illustrates a method of operating a successive approximation register logic circuit according to an embodiment of the present invention.

FIG. 10 illustrates a method of operating a successive approximation register logic circuit according to an embodiment of the present invention. In act 1010, a next successive approximation register bit is set. This results in a change in the variable delay in act 1020. From this, an output clock is generated in act 1030. The output clock is integrated to generate a decision signal in act 1040. The decision signal is stored as a bit value in the successive approximation registers in act 1050.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A method of improving a duty cycle of a periodic signal, the method comprising:
receiving a periodic signal;
delaying the periodic signal a fixed duration to generate a first signal;
delaying the periodic signal a variable duration to generate a second signal, the variable duration controlled by a count;
using the first signal and the second signal to construct an output signal;
integrating the output signal;
with the integrated output signal, using successive approximation to generate a first plurality of bits of the count; and
with the integrated output signal, linearly generating a second plurality of bits of the count.

2. The method of claim 1 wherein the periodic signal is a clock signal.

3. The method of claim 1 wherein the variable duration may be set to be shorter than, equal to, or longer than the fixed delay.

4. The method of claim 1 wherein first edges of the first signal and second edges of the second signal are used to construct the output signal.

5. The method of claim 1 wherein the first plurality of bits of the count comprise the most significant bits of the count.

6. The method of claim 1 wherein the second plurality of bits of the count comprise the least significant bits of the count.

7. A circuit to improve a duty cycle of a periodic signal, the circuit comprising:
a fixed delay element to provide a fixed delay;
a variable delay element to provide a variable delay, the variable delay controlled by a count;
a latch circuit coupled to an output of the fixed delay element and an output of the variable delay element to provide an output signal having an improved duty cycle;
an integrator coupled to an output of the latch circuit to integrate an input signal;

a successive approximation logic circuit coupled to an output of the integrator and to provide a first part of the count; and a linear logic circuit coupled to an output of the integrator and to provide a second part of the count.

8. The circuit of claim 7 wherein the fixed delay element and the variable delay element are coupled to receive the periodic signal.

9. The circuit of claim 8 wherein the periodic signal is a clock signal.

10. The circuit of claim 7 wherein the first part of the count comprises the most significant bits of the count.

11. The circuit of claim 10 wherein the second part of the count comprises the least significant bits of the count.

12. The circuit of claim 7 wherein the fixed delay element and the variable delay element comprise current-starved inverters.

13. The circuit of claim 7 wherein the latch circuit uses first edges of the output of the fixed delay element and second edges of the output of the variable delay element to generate the output signal.

14. The circuit of claim 7 wherein the circuit is located on a dynamic random access memory.

15. A method of generating an output clock signal having an improved duty cycle, the method comprising:

receiving an input clock signal;

delaying the input clock signal a variable duration;

using the delayed input clock signal to generate the output clock signal;

determining whether the duty cycle of the output clock signal is less than or greater than 50 percent;

using the determination in a successive approximation to generate bits for a count, wherein the count sets the variable duration; and using the determination in a linear approximation to generate bits for the count.

16. The method of claim 15 wherein the input clock signal is received from a delay-locked loop.

17. The method of claim 15 wherein the output clock signal is provided to a delay-locked loop.

18. The method of claim 15 wherein the successive approximation generates the most significant bits of the count.

19. The method of claim 15 wherein the linear approximation generates the least significant bits of the count.

20. The method of claim 15 wherein first edges of the delayed input clock signal are used to generate the output clock signal.

* * * * *